United States Patent [19]
Ko

[11] Patent Number: 5,950,095
[45] Date of Patent: Sep. 7, 1999

[54] SEMICONDUCTOR MEMORY CELL FABRICATION METHOD

[75] Inventor: Sang-Gi Ko, Choongcheongbuk-Do, Rep. of Korea

[73] Assignee: LG Semicon Co., Ltd., Cheongju, Rep. of Korea

[21] Appl. No.: 08/847,334

[22] Filed: Apr. 23, 1997

[30] Foreign Application Priority Data

Apr. 30, 1996 [KR] Rep. of Korea ..................... 96-13840

[51] Int. Cl.[6] .................................................. H01L 21/76
[52] U.S. Cl. ........................ 438/443; 438/297; 438/449; 438/450; 438/298
[58] Field of Search .................................. 438/443, 225, 438/297, 298, 449, 450

[56] References Cited

U.S. PATENT DOCUMENTS 5,208,470   5/1993   Lee et al. ................................. 257/296

*Primary Examiner*—Trung Dang
*Attorney, Agent, or Firm*—Fleshner & Kim

[57] ABSTRACT

A semiconductor device includes a substrate having an active region between field oxide films, a gate formed on the substrate with a gate oxide therebetween, and a first impurity region formed adjacent to each side of the gate. A second impurity region is formed between the field oxide film and the first impurity region and a first insulating film with a contact hole exposes portions of the first and second impurity regions. An electrode formed in the contact hole such that the portions of the first and second impurity regions overlap an area in the substrate beneath the electrode. A method of forming an active region for a semiconductor device comprises the steps of: (a) forming a plurality of field oxide films in a prescribed pattern in x and y directions on a surface of a semiconductor substrate; (b) removing a bird beak portion of each of the plurality of field oxide films; and (c) doping a prescribed portion of an area of the semiconductor substrate, where each beak portion has been removed, with a prescribed concentration of a dopant.

15 Claims, 6 Drawing Sheets

SEMICONDUCTOR MEMORY CELL FABRICATION METHOD

BACKGROUND OF THE INVENTION

1. Field of the Invention

The present invention relates to a semiconductor memory cell fabrication method thereof. More particularly, the invention relates to a method for a semiconductor memory cell with non-overlapping active regions in the lengthwise direction with adjacent active regions.

2. Background of the Related Art

FIGS. 1A through 1E are cross-sectional views illustrating sequential fabrication steps of a semiconductor memory cell in the related art.

Referring to FIG. 1A, on a semiconductor substrate 1 having a well (not shown) therein there are sequentially deposited an oxide film 2 and a nitride film 3 so as to define a field region and an active region in a portion of substrate 1, and an active pattern is formed thereon by an etching technique.

As shown in FIG. 1B, using the active pattern as a mask, the semiconductor substrate 1 is oxidized to form a field oxide film 4, and the active pattern is removed by etching to thereby expose an active region 3a externally. A punch-through stop ion-implanting is carried out into the substrate 1. With reference to FIG. 1C, a gate oxide film 5 and a gate polysilicon 6 and at least one gate electrode pattern is sequentially deposited by means of a photolithographic process and an etching process. In FIG. 1C, an N⁻ field mask is employed to carry out a field stop ion-implanting prior to formation of field oxide film 4. Then, the nitride film 3 is eliminated, a punch-through stop ion-implanting and a channel ion-implanting are carried out, the oxide film 2 is removed, and the gate oxide film 5 and gate polysilicon 6 are sequentially deposited on the exposed active region 3a. Here, a gate electrode pattern can be formed by a photolithographic process and an etching process.

On the substrate 1 including the gate electrode pattern there are respectively deposited a high temperature low pressure dielectric and side wall spacers 7 by a reactive ion etching. Using the gate electrode pattern as a mask, an ion-implanting is carried out into the active region of the substrate 1 to form at least one impurity region 8 which serves as a source/drain region.

As shown in FIG. 1D, an interlayer dielectric (hereinafter, called "ILD") film 9 is formed on the semiconductor substrate 1, including the gate electrode pattern and a contact hole 10 is formed by etching a portion of ILD film 9 to expose therethrough respective portions of more than one impurity region.

Referring to FIG. 1E, a bit line 11 is formed on ILD film 9 including in the contact hole 10 therethrough. Another insulating layer 12 is deposited on ILD film 9 including the bit line 11 and then the insulating layer 12 is etched to expose a portion of the impurity region 8 to thereby form a node contact hole 13. Thereafter, a node electrode 14 is formed on the insulating layer 12 and in the node contact hole 13.

FIGS. 2A through 2C illustrate layouts of partial steps for the above memory cell fabrication process. With reference to FIG. 2A, there are provided a field region defined in accordance with field oxide film 4 grown by a LOCOS method and a plurality of active regions 3a on the field region. The field oxide film 4 grown between the neighboring or adjacent active regions 3a is formed to be thinner ("+" regions) in thickness, compared to other regions. As shown in FIG. 2B, a gate 6 and a field oxide film 4 formed on the active regions 3a. Referring to FIG. 2C, a contact hole 10 and a node contact hole 13 are formed on the active regions 3a.

As described above, when an active region is formed using a LOCOS method during a semiconductor fabrication and if it is applied to a DRAM of more than 64M, the cell area is decreased due to a large scale integration. Therefore, the space between active regions becomes decreased and the thickness of a field oxide film, which grows in a narrow space, becomes excessively thinner relative to the thickness of a field oxide film which is grown so as to isolate devices from a region having larger spaces in between the active regions. As a result, the isolation characteristic can be damaged resulting in a decreased threshold voltage.

The above references are incorporated by reference herein where appropriate for appropriate teachings of additional or alternative details, features and/or technical background.

SUMMARY OF THE INVENTION

It is an object of the present invention to solve the problems of the related art.

It is another object of the present invention to provide a semiconductor memory cell fabrication method for growing a field oxide film having a certain thickness to widen the space between active regions.

It is another object of the present invention to provide a semiconductor memory cell fabrication method for securing a sufficiently wide active region by etching a field oxide film having a certain thickness.

To achieve the above-described objects, there is provided a semiconductor memory cell fabrication method which includes the steps of forming a field oxide film having a predetermined thickness on a semiconductor substrate having an active region thereon so as to cover the active region, removing a selected portion of the field oxide film, forming at least one gate electrode on a predetermined portion of the active region, forming a first source region and a drain region on the substrate on each side of the gate electrode, forming an interlayer dielectric film on the substrate including the gate electrode thereon, forming a contact hole by etching the interlayer dielectric film, forming a bit line on a predetermined region on the substrate and in the contact hole therein, forming a node contact hole by etching the interlayer dielectric film so as to expose a portion of the first source region and a portion of the field region adjacent to the first source region, and forming a node electrode on the interlayer dielectric film and in the node contact hole therethrough.

Further, there is provided a semiconductor memory cell fabrication method in accordance with the present invention, wherein a field stop ion implanting and a channel ion implanting are carried out after forming the field oxide film.

Still further, there is provided a semiconductor memory cell fabrication method in accordance with the present invention, wherein a forming process of the node electrode comprises the steps of depositing an undoped polysilicon, and implanting impurity ions in the undoped polysilicon.

Yet further, there is provided a semiconductor memory cell fabrication method in accordance with the present invention, wherein the node electrode is formed of a doped polysilicon.

The present invention may be also achieved in part or in whole by a semiconductor memory cell fabrication method, comprising the steps of: forming a field oxide film having a predetermined thickness on a semiconductor substrate having at least one active region therein so as to cover the at least one active region; removing a selected portion of the field oxide film to expose at least part of the at least one active region; forming at least one gate electrode on a predetermined portion of the active region; forming a source region and a drain region in the substrate on each side of the gate electrode; forming an interlayer dielectric film on the substrate including the gate electrode thereon; forming a contact hole by etching the interlayer dielectric film; forming a bit line on a predetermined region on the substrate and in the contact hole therein; forming an insulating layer on the interlayer dielectric layer; forming a node contact hole by exposing a portion of the first source region and a portion of the field region adjacent to the first source region; and forming a node electrode on the interlayer dielectric film and in the node contact hole therethrough.

The object, advantages and/or features may be also achieved in part or in whole by a method of forming an active region for a semiconductor device, comprising the steps of: (a) forming a plurality of field oxide films in a prescribed pattern in x and y directions on a surface of a semiconductor substrate; and (b) removing edges of field oxide films to form an active region between adjacent field oxide films, that extends in the x-direction.

It may also be achieved in part or in whole by a method of forming a plurality of semiconductor devices, comprising: (a) forming a plurality of field oxide films in a prescribed pattern in x and y directions on a surface of a semiconductor substrate; (b) removing edges of field oxide films to form an active region, between adjacent field oxide films, that extends in the x-direction; (c) forming the plurality of semiconductor devices in the active regions; and (d) doping a prescribed portion of an area of the semiconductor substrate, where edges of the field oxide films have been removed, with a prescribed concentration of a dopant, wherein each active region is defined between adjacent prescribed portions such that each active region extending in the x-direction is non-overlapping with each adjacent active region in the y-direction.

The present invention may be also achieved in part or in whole by a semiconductor device comprising: a substrate having an active region between field oxide films; a gate formed on the substrate with a gate oxide therebetween; a first impurity region formed adjacent to each side of the gate; a second impurity region formed between the field oxide film and the first impurity region; a first insulating film with a contact hole to expose portions of the first and second impurity regions; and an electrode formed in the contact hole such that the portions of the first and second impurity regions overlap an area in the substrate beneath the electrode.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1A:
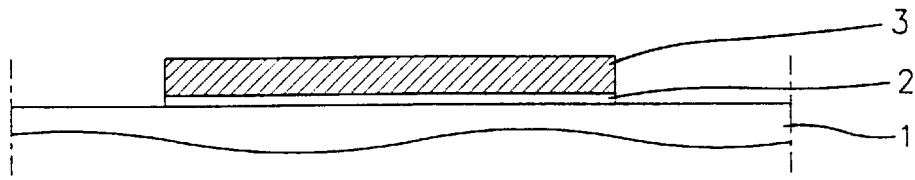
FIGS. 1A through 1E are sequential schematic cross-sectional views illustrating a memory cell fabrication process of the related art.
Figure 1B:
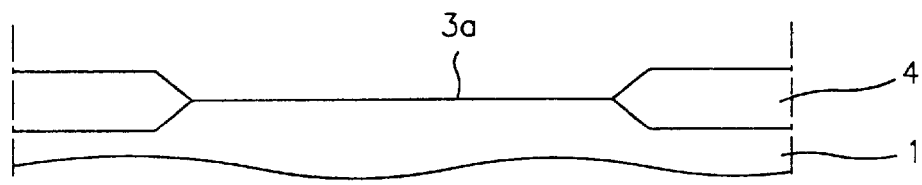
Figure 1C:
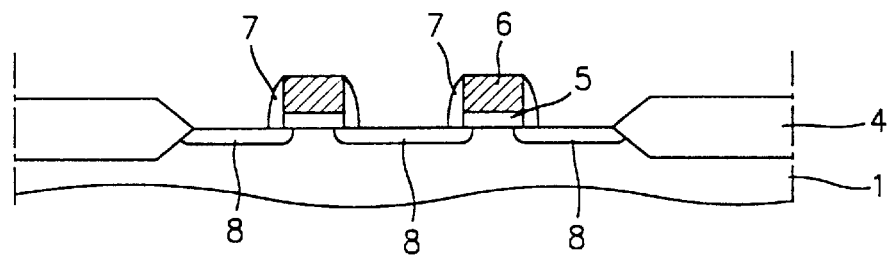
Figure 1D:
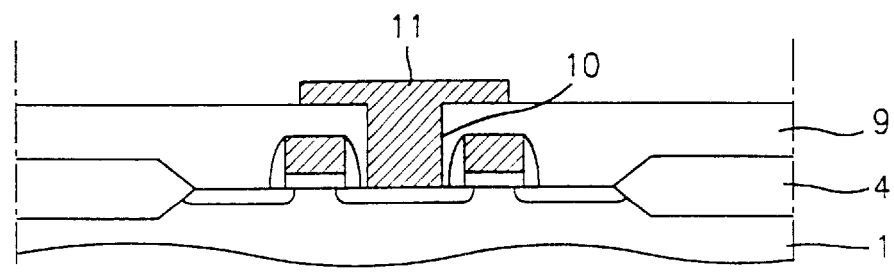
Figure 1E:
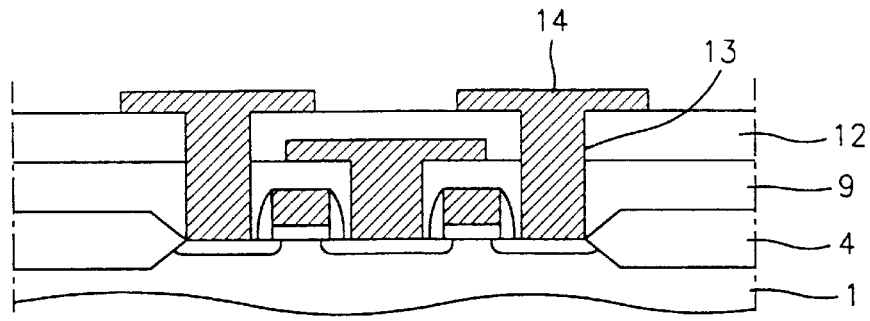
Figure 2A:
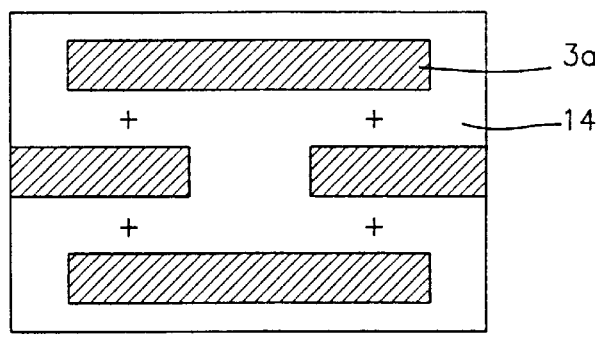
FIGS. 2A through 2C are layout views illustrating partial steps of the semiconductor memory cell fabrication process of the related art.
Figure 2B:
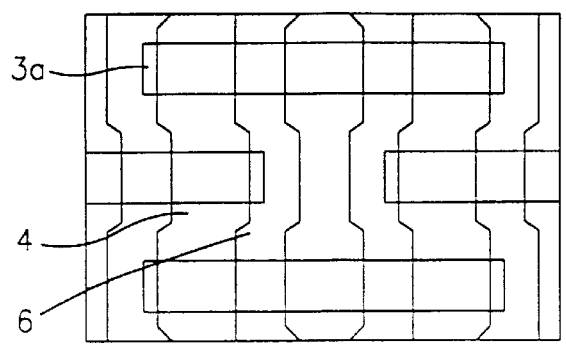
Figure 2C:
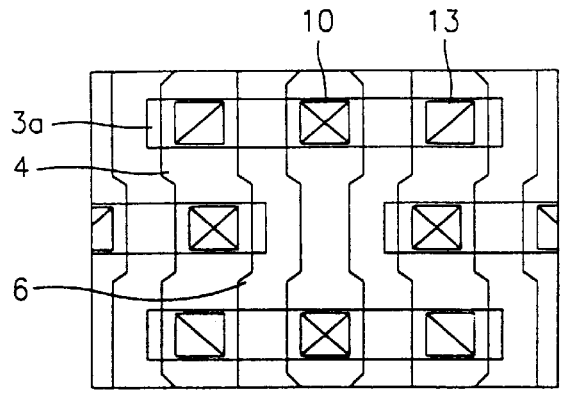
Figure 3A:
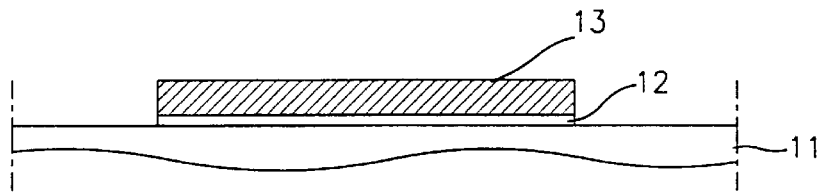
FIGS. 3A through 3E are sequential schematic cross-sectional views illustrating a memory cell fabrication process according to the present invention.
Figure 3B:
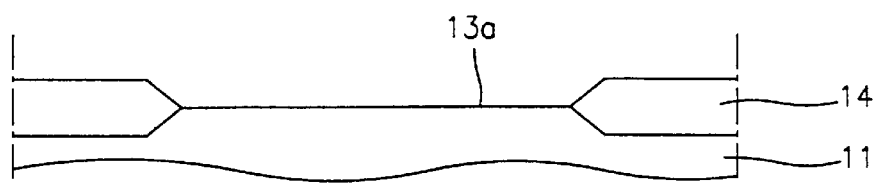

As shown in FIG. 3A, a base oxide film 12 and a nitride film 13 are sequentially deposited and patterned on a semiconductor substrate 11 having a well (not shown). As shown in FIG. 3B, using the patterned oxide film 12 and nitride film 13 as a mask, a field oxide film 14 is formed by using a LOCOS method, and then the patterned oxide film 12 and nitride film 13 are removed to thereby expose an active region 13a therethrough.

Figure 3C:
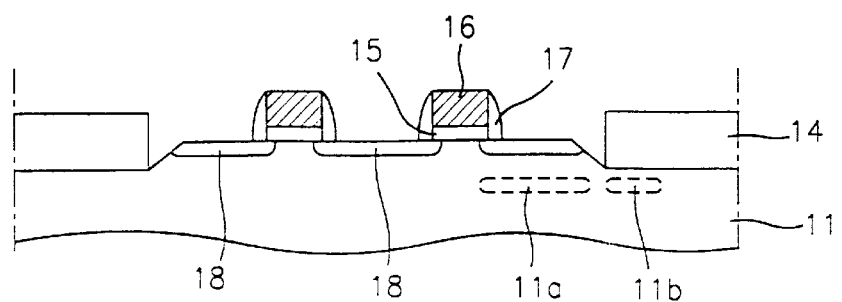

Referring to FIG. 3C, on substrate 11, there is formed a buffer oxide film (not shown) into which are implanted $N^-$ ions to thereby form a punch-through stop region 11a and a field stop region 11b, respectively, in the substrate 11. Then, by a wet etching process, a bird beak portion, which is a part of the buffer oxide film and the field oxide film 14, is eliminated. Thereafter, on the active region 13a, there are deposited a gate oxide film 15 and a gate polysilicon 16, and then a photolithographic process and an etch process are carried out to thereby form at least one gate electrode pattern. Thereafter, $N^-$ ions are implanted into the substrate 11 to form at least one impurity region 18 which overlap on a lower surface of the gate electrode pattern. Then, on the substrate 11 including the gate electrode pattern there is deposited a high temperature and low pressure oxide film, and by using an etching technique, a side wall spacer 17 are formed on the side walls of the gate electrode pattern.

Figure 3D:
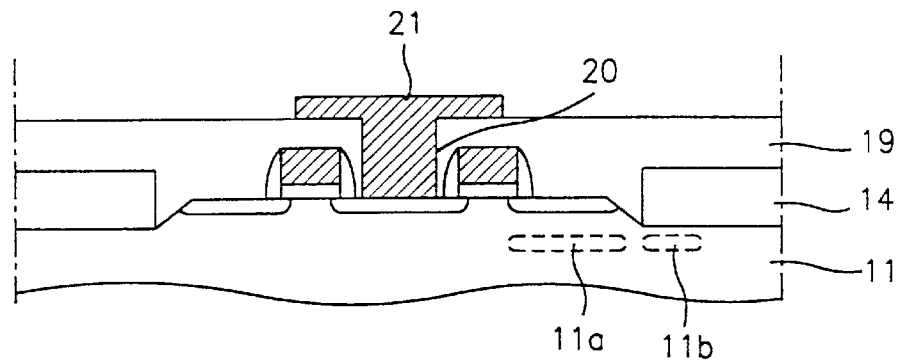

As shown in FIG. 3D, an ILD film 19 is deposited on substrate 11 including the gate electrode pattern thereon and an etching technique is applied thereto to expose a portion of at least one impurity region 18 for thereby forming a contact hole 20 therethrough. Then, a bit line 21 is formed in the contact hole 20 and on a portion of ILD 19.

Figure 3E:
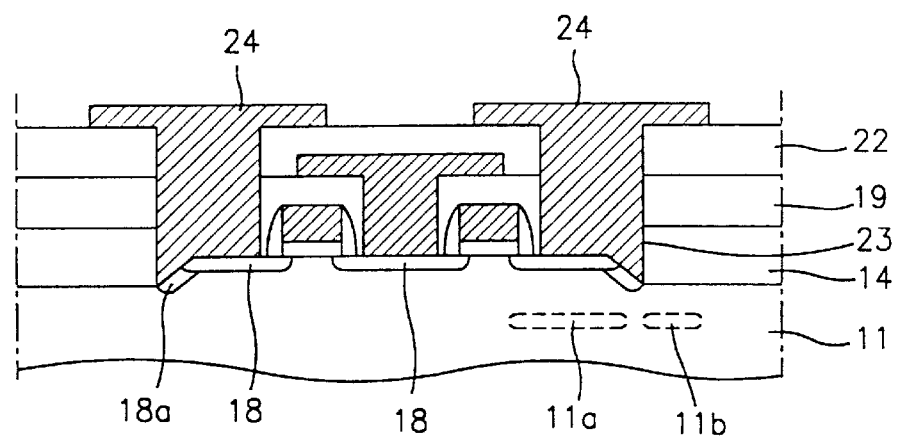

Referring to FIG. 3E, an insulating film 22 is optionally deposited on ILD film 19 including the bit line 21, a certain region of the insulating film 22 is etched to form a node contact hole 23, and a node electrode 24 is formed in the node contact hole 23 and on a portion of the insulating film 22. Here, the node electrode 24, which is formed of a doped polysilicon, causes impurities to be automatically doped by diffusion into the substrate to form an $N^-$ region 18a overlapped with the impurity region 18. The node electrode 24 may be formed by first depositing an undoped polysilicon and then carrying out an ion-implanting therein at a next step.

Figure 4A:
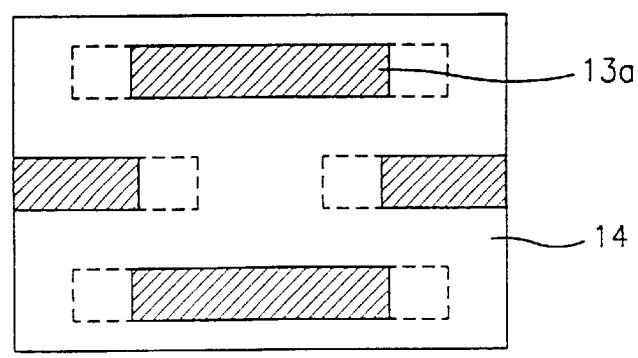
FIGS. 4A through 4C are layout views illustrating partial steps of the semiconductor memory cell fabrication process according to the present invention.
Figure 4B:
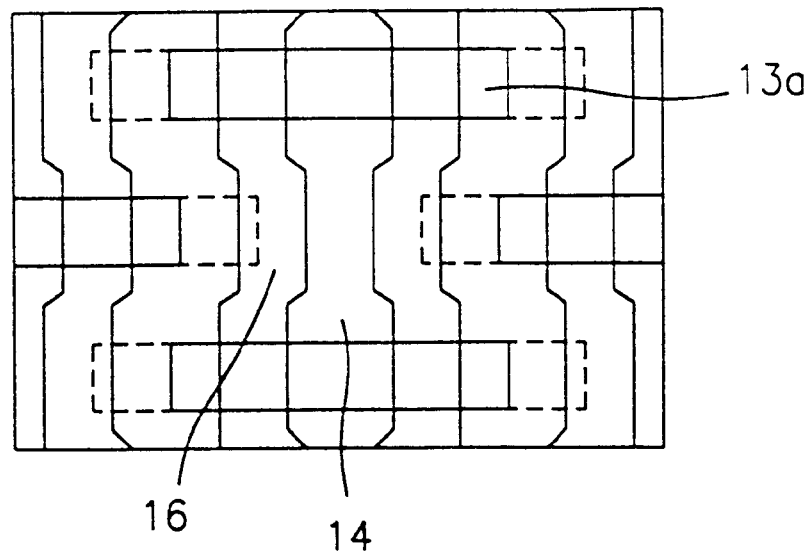
Figure 4C:
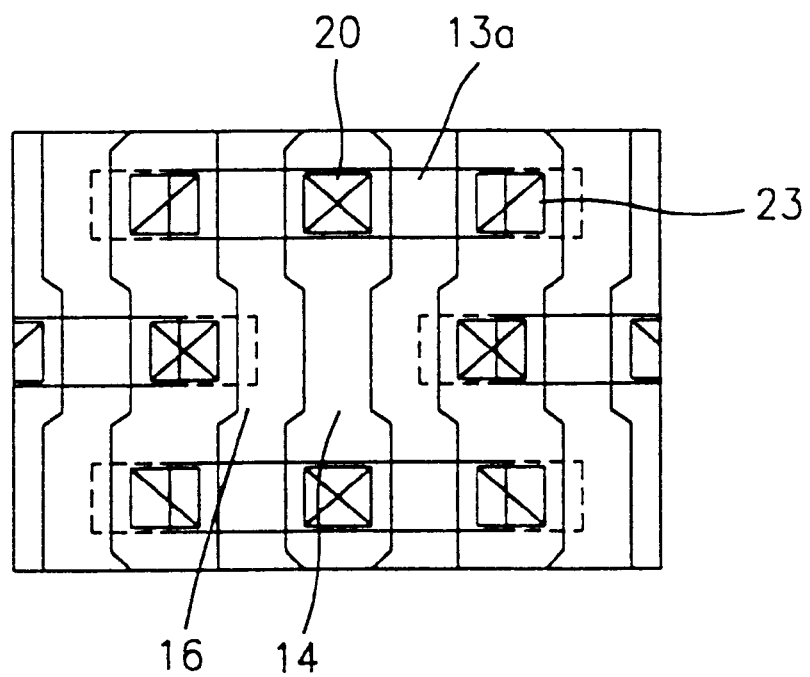

FIGS. 4A through 4C are layout views of the semiconductor memory cell fabrication process according to the present invention.

As shown in FIG. 4A, on the field region there are defined a field oxide film 14 grown by a LOCOS method and a plurality of active regions 13a. The neighboring active regions 13a are not overlapped with each other so that the field oxide film 14 grown around the active regions 13a has a constant thickness. The dotted lines in FIG. 4A are provided to indicate a horizontal length of each active region 13a, which is decreased by a certain degree compared to the active region of the related art, whereby it is possible to overcome a difference in the field oxide thickness resulting from an active region being overlapped with other active regions. FIG. 4B shows the gate 16 and the field oxide film 14 which are formed on the active regions 13a. In FIG. 4C, the contact hole 20 and the node contact hole 23 are formed in each active region 13a. The horizontal length of each active region 13a does not thoroughly include the node contact hole 23, but it is partially overlapped therewith.

Figure 5:
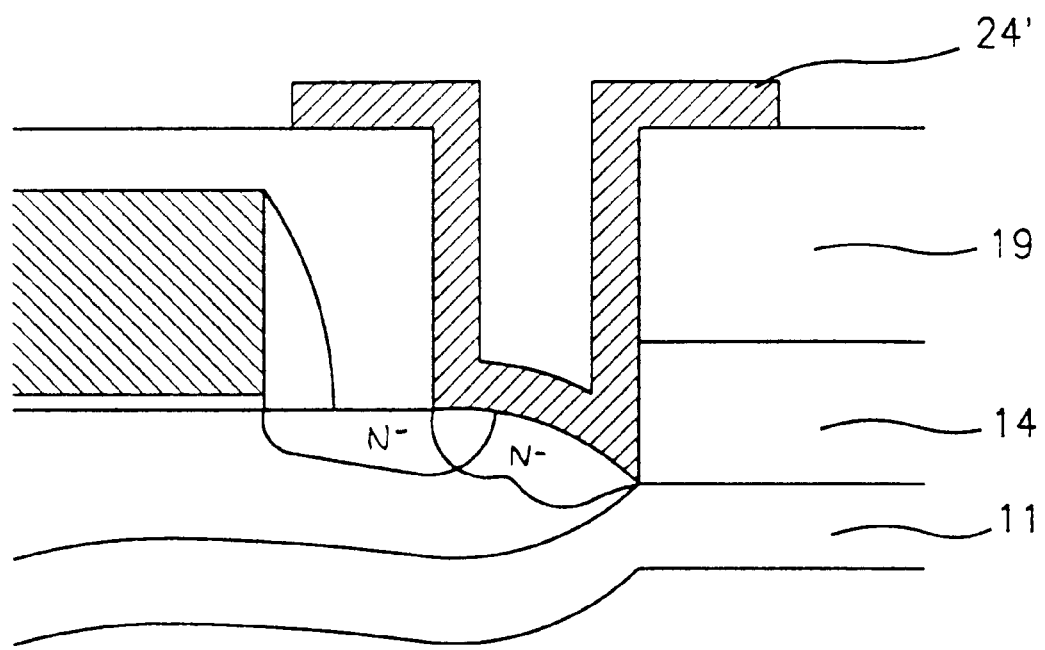
FIG. 5 is a cross sectional view of an alternative node electrode made under the practice of the invention.

As shown in FIG. 5, the invention also encompasses an embodiment wherein the interlayer dielectric film (ILD) on the substrate is etched to form a contact hole so as to expose a portion of the first source region and a portion of the filed regions adjacent to the first source region (numbering is as in FIG. 3). In this embodiment, the insulation film 22 is omitted, and the node electrode 24' is formed using a layer of polysilicon which does not completely fill the contact hole.

As described above, the semiconductor memory cell fabrication in accordance with the present invention enables a memory cell fabrication having an improved device isolation characteristic and a higher reliability by making the growing field oxide film thickness constant in accordance with a wide space being formed between the active regions.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A semiconductor memory cell fabrication method comprising the steps of:
   forming a field oxide film on a semiconductor substrate having an active region therein, wherein the active region is bordered by longitudinal sides and ends;
   removing a selected portion of the field oxide film along at least one end of the active region;
   forming at least one gave electrode on a portion of the active region;
   forming a first source region and a drain region in the substrate on each side of the gate electrode;
   forming an interlayer dielectric film on the substrate including the gate electrode thereon;
   forming a contact hole by etching the interlayer dielectric film;
   forming a bit line on a region on the substrate and in the contact hole therein;
   forming a node contact hole by etching the interlayer dielectric film so as to expose a portion of the first source region and a portion of the field region adjacent to the first source region from which the selected portion of the field oxide film was removed; and
   forming a node electrode on the interlayer dielectric film and in the node contact hole therethrough.

2. The method of claim 1, wherein a field stop ion implanting and a channel ion implanting are carried out after forming the field oxide film.

3. The method of claim 1, wherein a forming process of the node electrode comprises the steps of depositing an undoped polysilicon, and implanting impurity ions in the undoped polysilicon.

4. The method of claim 1, wherein the node electrode is formed of a doped polysilicon.

5. The method of claim 1, wherein the first source region and a second source region are overlapped with each other.

6. The method of claim 1, wherein a portion of the node contact hole is overlapped with the active region.

7. A semiconductor memory cell fabrication method, comprising the steps of:
   forming a field oxide film on a semiconductor substrate having at least one active region therein, the active region being bordered by ends and longitudinal sides;
   removing a portion of the field oxide film at least one end of the active region to expose at least part of the substrate;
   forming at least one gate electrode on a portion of the active region;
   forming a source region and a drain region in the substrate on each side of the gate electrode;
   forming an interlayer dielectric film on the substrate including the gate electrode thereon;
   forming a contact hole by etching the interlayer dielectric film;
   forming a bit line on a region on the substrate and in the contact hole therein;
   forming an insulating layer on the interlayer dielectric layer;
   forming a node contact hole by exposing a portion of the source region and a portion of the field region adjacent to the source region; and
   forming a node electrode on the interlayer dielectric film and in the node contact hole therethrough such that the source region extends into a portion of the substrate from which the selected portion of the field oxide film was removed.

8. A method of forming an active region for a semiconductor device, comprising the steps of:
   (a) forming a plurality of field oxide films in a prescribed pattern in x and y directions on a surface of a semiconductor substrate to define a plurality of active regions that extend in the x direction, wherein active regions that are adjacent in the y direction do not overlap in the x direction; and
   (b) removing edges of the field oxide films at ends of the active regions.

9. The method of claim 8, wherein step (a) comprises the steps of:
   forming a patterned mask with areas defined by the prescribed pattern exposed;
   oxidizing of the exposed areas of the semiconductor substrate; and
   removing the patterned mask.

10. The method of claim 9, wherein the patterned mask comprises:
    an oxide film formed on the semiconductor substrate; and
    a nitride film formed on the oxide film.

11. The method of claim 8, wherein step (b) comprises of:
    removing a bird beak portion of each of the plurality of field oxide films,
    and further comprising a step of doping a prescribed portion of an area of the semiconductor substrate, where each bird beak portion has been removed, with a prescribed concentration of a dopant.

12. The method of claim 11, wherein the doping step comprises diffusing a low concentration of n-type dopant at the area adjacent to each field oxide film.

13. A method of forming a plurality of semiconductor devices, comprising:
 (a) forming a plurality of field oxide films in a prescribed pattern in x and y directions on a surface of a semiconductor substrate to define a plurality of active regions having ends that extend in the y direction and longitudinal sides that extend in the x direction;
 (b) removing edges of field oxide films at ends of the active regions;
 (c) forming the plurality of semiconductor devices in the active regions; and
 (d) doping prescribed portions of areas of the semiconductor substrate, where edges of the field oxide films have been removed, with a prescribed concentration of a dopant.

14. The method of claim 13, wherein step (c) comprises the steps of:
 forming a gate on at least one active region of the semiconductor substrate with a gate oxide therebetween; and
 forming an impurity region in the semiconductor substrate adjacent to an edge of said gate oxide.

15. The method of claim 14, wherein step (d) further comprises the steps of:
 forming an insulating film over said gate, impurity region, the prescribed portions and the field oxide films;
 forming a contact hole through the insulating film by exposing a prescribed area of the impurity region and one of the prescribed portions;
 forming a polysilicon layer in the contact hole; and
 doping the polysilicon with the dopant such that the dopant diffuses into the prescribed portion.

* * * * *